United States Patent
Shen et al.

(10) Patent No.: US 10,839,914 B2
(45) Date of Patent: *Nov. 17, 2020

(54) PHYSICAL SECURE ERASE OF SOLID STATE DRIVES

(71) Applicant: Western Digital Technologies, Inc., San Jose, CA (US)

(72) Inventors: Zhenlei Z. Shen, Milpitas, CA (US); Nian Niles Yang, Mountain View, CA (US); Gautham Reddy, San Jose, CA (US)

(73) Assignee: WESTERN DIGITAL TECHNOLOGIES, Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/392,252

(22) Filed: Apr. 23, 2019

(65) Prior Publication Data
US 2019/0252025 A1 Aug. 15, 2019

Related U.S. Application Data

(62) Division of application No. 15/605,102, filed on May 25, 2017, now Pat. No. 10,297,324.

(51) Int. Cl.
*G11C 16/16* (2006.01)
*G11C 29/00* (2006.01)
(Continued)

(52) U.S. Cl.
CPC .......... *G11C 16/16* (2013.01); *G11C 11/5628* (2013.01); *G11C 11/5635* (2013.01);
(Continued)

(58) Field of Classification Search
None
See application file for complete search history.

(56) References Cited

U.S. PATENT DOCUMENTS 6,895,464 B2  5/2005  Chow et al.
8,239,714 B2  8/2012  Flynn et al.
(Continued)

FOREIGN PATENT DOCUMENTS

CN   101465164 B   4/2013

OTHER PUBLICATIONS

Jon Tanguy; Micron; Securely Erasing Micron SATA SSDs; dated 2014; 3 total pages.

*Primary Examiner* — James G Norman
(74) *Attorney, Agent, or Firm* — Patterson & Sheridan, LLP; Steven H. Versteeg

(57) ABSTRACT

Embodiments of the present disclosure relate to physical secure erase (PSE) of solid state drives (SSDs). One embodiment of a method of PSE of a SSD includes receiving a PSE command, erasing the memory cells of the blocks, programming the memory cells, and programming the select gates to a portion of the blocks. One embodiment of a SSD includes a controller and a plurality of blocks having a plurality of NAND strings. Each NAND string includes connected in series a select gate drain, memory cells, and a select gate source. The SSD includes a memory erasing instruction that cause the controller to erase the memory cells of the block, program the memory cells, and increase the threshold voltage to the select gate drain and/or the select gate source of some of the NAND strings from the blocks.

20 Claims, 6 Drawing Sheets

(51) Int. Cl.
  *G11C 11/56* (2006.01)
  *G11C 29/44* (2006.01)
  *G11C 29/52* (2006.01)
  *G11C 16/08* (2006.01)
  *G11C 16/04* (2006.01)

(52) U.S. Cl.
  CPC .............. *G11C 16/08* (2013.01); *G11C 29/44* (2013.01); *G11C 29/52* (2013.01); *G11C 29/765* (2013.01); *G11C 29/832* (2013.01); *G11C 16/0483* (2013.01)

(56) References Cited

U.S. PATENT DOCUMENTS

| | | | |
|---|---|---|---|
| 8,767,467 | B2 | 7/2014 | Parat et al. |
| 8,908,435 | B2 | 12/2014 | Li et al. |
| 8,966,330 | B1 | 2/2015 | Raghu et al. |
| 10,297,324 | B2 * | 5/2019 | Shen .................. G11C 29/44 |
| 2006/0250855 | A1 | 11/2006 | Van Duuren |
| 2013/0343129 | A1 * | 12/2013 | Wakchaure ............ G11C 16/10 365/185.17 |
| 2014/0269079 | A1 | 9/2014 | Kamigaichi |
| 2015/0063028 | A1 | 3/2015 | Raghu et al. |
| 2017/0194052 | A1 * | 7/2017 | Schmier ................ G11C 16/16 |

\* cited by examiner

PHYSICAL SECURE ERASE OF SOLID STATE DRIVES

CROSS-REFERENCE TO RELATED APPLICATIONS

This application is a divisional of co-pending U.S. patent application Ser. No. 15/605,102, filed May 25, 2017, which is herein incorporated by reference.

BACKGROUND OF THE DISCLOSURE

Field of the Disclosure

Embodiments of the present disclosure generally relate to physical secure erase of solid state drives.

Description of the Related Art

Securely erasing data from solid state drives (SSDs) is important in protecting sensitive information. A host can issue a physical secure erase (PSE) command to a SSD requesting that the data be destroyed. A PSE operation may involve an erase operation followed by a flash write operation to the blocks. However, even after such a PSE operation, some data may still be able to be read out. Therefore, there is a need for an improved method of performing a PSE and an improved SSD that performs a PSE.

SUMMARY OF THE DISCLOSURE

Embodiments of the present disclosure relate to PSE of solid state drives. One embodiment of a method of PSE of a SSD includes receiving a PSE command, performing an erase operation to the memory cells of the blocks, performing a memory programming operation to the memory cells of blocks, and performing a select gate programming operation to a plurality of select gates to a portion of the blocks. One embodiment of a SSD includes a controller and a plurality of blocks having a plurality of NAND strings. Each NAND string includes connected in series a select gate drain, a plurality of memory cells, and a select gate source. The SSD includes a memory erasing instruction that, when executed by the controller, cause the controller to perform an erase operation to the memory cells of the blocks, program the memory cells of the blocks, and increase a threshold voltage to the select gate drain and/or select gate source of some of the NAND strings from the blocks. One embodiment of a non-transitory computer readable storage medium includes a storage medium containing instructions that, when executed by a controller, performs an erase operation to a plurality of memory cells of the blocks, a flash write operation to the memory cells of the blocks, and an increase to a threshold voltage of a plurality of select gates from a portion of the blocks that is bad. Another embodiment of a solid state drive includes a controller, a means for storing data in a plurality of memory cells, and a memory erasing instruction that, when executed by the controller, cause the controller to erase and to program a first portion of memory cells and render a second portion of memory cells unreadable.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

In the following, reference is made to embodiments of the disclosure. However, it should be understood that the disclosure is not limited to specific described embodiments. Instead, any combination of the following features and elements, whether related to different embodiments or not, is contemplated to implement and practice the disclosure. Furthermore, although embodiments of the disclosure may achieve advantages over other possible solutions and/or over the prior art, whether or not a particular advantage is achieved by a given embodiment is not limiting of the disclosure. Thus, the following aspects, features, embodiments and advantages are merely illustrative and are not considered elements or limitations of the appended claims except where explicitly recited in a claim(s). Likewise, reference to "the disclosure" shall not be construed as a generalization of any inventive subject matter disclosed herein and shall not be considered to be an element or limitation of the appended claims except where explicitly recited in a claim(s).

Figure 1:
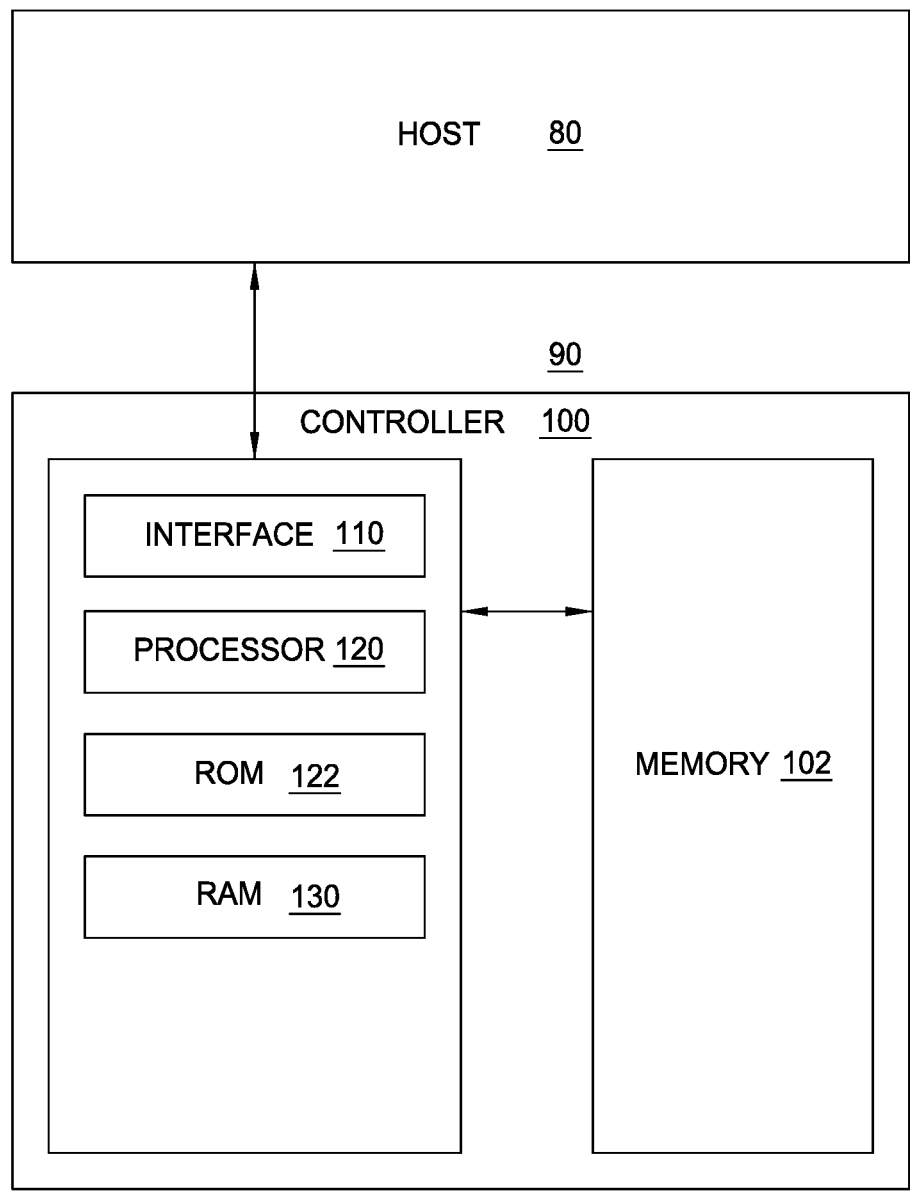
FIG. 1 is a schematic diagram of a SSD according to one embodiment.

FIG. 1 is a schematic diagram of one embodiment of a SSD 90 suitable for implementing the present invention. The SSD 90 operates with a host 80 through a host interface. The SSD 90 may be in the form of a removable memory such as a memory card or may be in the form of an embedded memory system. The SSD 90 includes non-volatile memory 102 controlled by a controller 100. The non-volatile memory 102 includes one or more arrays of non-volatile memory cells. The controller 100 includes interface circuits 110, a processor 120, ROM (read-only-memory) 122, RAM (random access memory) 130, and additional components not shown.

The non-volatile memory 102 may be configured for long-term data storage of information and retain information after power on/off cycles. Non-volatile memory can include one or more memory devices. Examples of non-volatile memory devices include flash memories, phase change memories, ReRAM memories, MRAM memories, electrically programmable read only memories (EPROM), electrically erasable programmable read only memories (EEPROM), and other solid-state memories. Non-volatile memory device may also have different configurations. For example, flash memory devices may be configured in a NAND or a NOR configuration.

Multiple memory cells may be configured so that they are accessed as a group or accessed individually. For example, flash memory devices in a NAND configuration typically contain memory cells connected in series. A NAND memory array may be configured so that the array is composed of multiple strings of memory in which a string is composed of multiple memory cells sharing a single bit line and accessed as a group. Alternatively, memory elements may be configured so that each element is individually accessible, such as in a NOR configuration. Memory configurations other than NAND or NOR memory configurations are possible.

Figure 2:
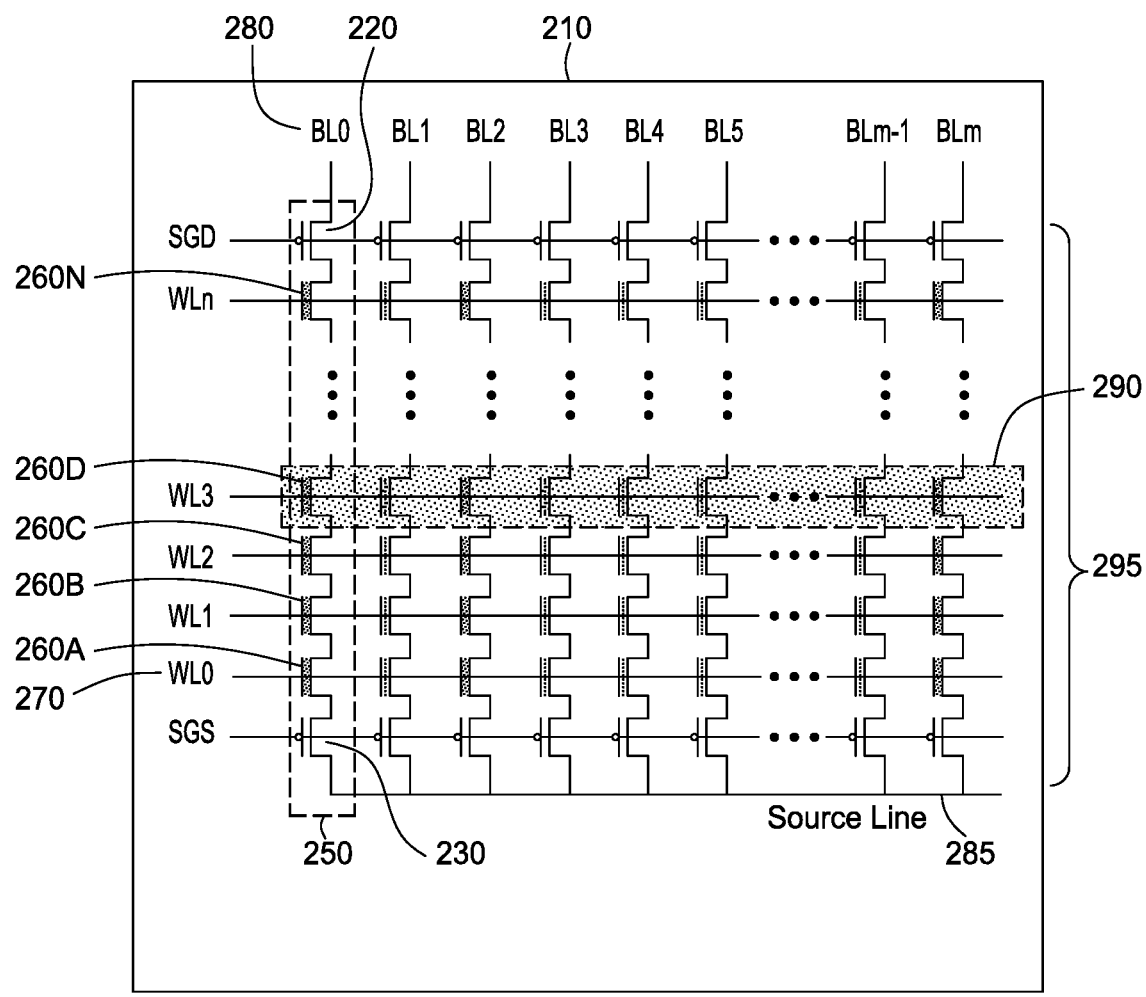
FIG. 2 is a schematic diagram of one example of a two dimensional memory array.

The memory cells may be arranged in two or three dimensions, such as a two dimensional memory array or a three dimensional memory array. FIG. 2 is a schematic diagram of one example of a two dimensional memory array 210, such as a 2D or planar NAND memory array. The memory array 210 includes a set of NAND strings 250. Each NAND string 250 comprises a memory cells 260A, 260B, 260C, 260D to 260N. Each NAND string 250 includes a select gate drain transistor (SGD) 220 and a select gate source transistor (SGS) 230. The memory array 210 includes multiple pages 290. Page 290 is accessed by the control gates of the cells of the page connected in common to a word line 270 and each cell accessible via bit lines 280. In other embodiments, the memory cells may be arranged in other configurations.

Figure 3:
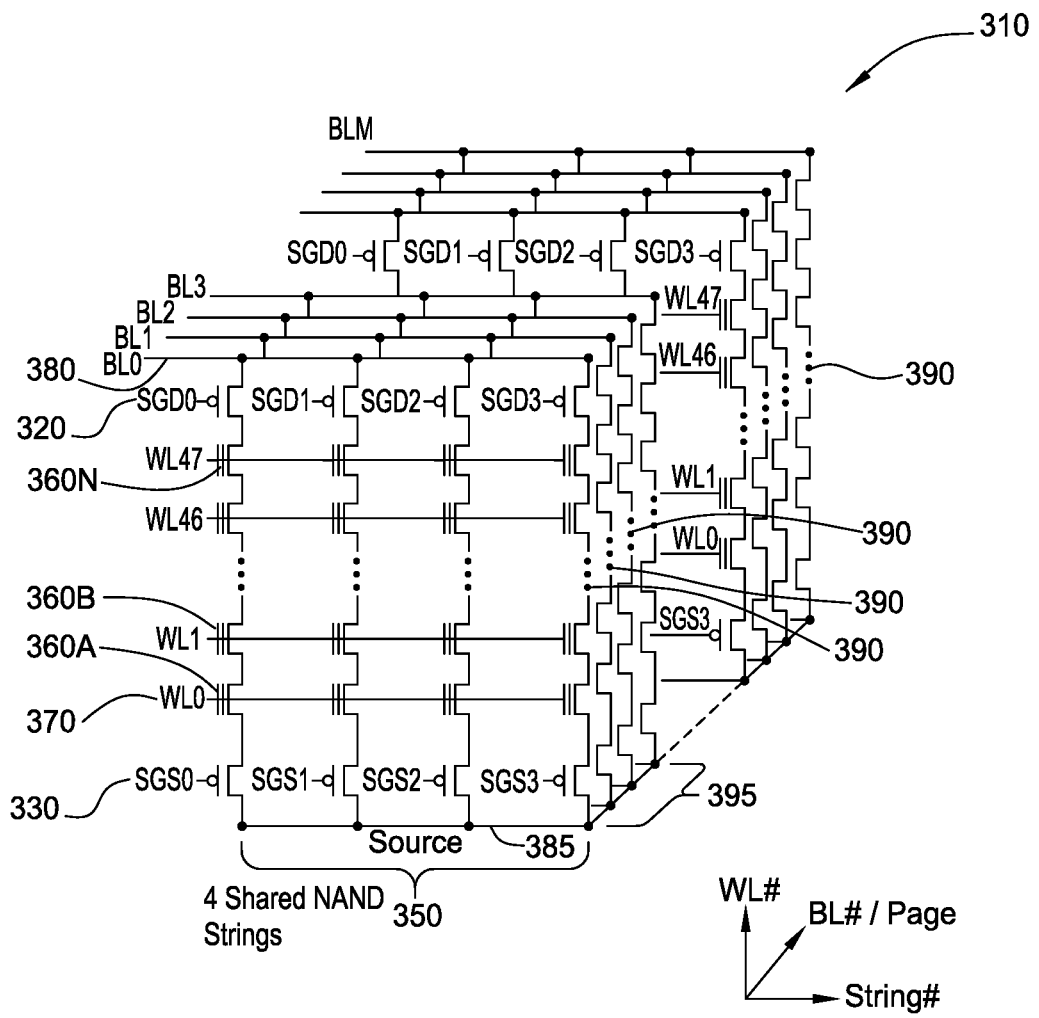
FIG. 3 is a schematic diagram of one example of a three dimensional memory array.

FIG. 3 is a schematic diagram of one example of a three dimensional memory array 310, such as a 3D or vertical NAND memory array or a BiCS2 cell array as shown. Memory array 310 is made up of a plurality of pages 390. Each page 390 includes a set of NAND strings 350 (four NAND strings are shown). Each set of NAND string 350 is connected in common to a bit line 380. Each NAND string 350 includes a select gate drain transistor (SGD) 320, a plurality of memory cells 360A, 360B, 360N, and a select gate source transistor (SGS) 330. A row of memory cells is connected in common to a word line 370.

The memory cells 260, 360 shown in FIGS. 2 and 3 are made up of a transistor that has a charge storage element to store a given amount of charge representing a memory state. The memory cells may be operated in a single-level cell (SLC) storing 1 bit of memory per cell, a MLC or X2 cell storing 2 bits of memory per cell, a X3 cell storing 3 bits of memory per cell, X4 cell storing 4 bits of memory per cell, or any types of memory cell storing any number of bits per cell. The SGDs 220, 320 and SGSs 320, 330 are transistors where the voltage levels are also programmed to a certain threshold voltage level. SGDs 220, 320 connect or isolate the drain terminals of the NAND strings 250, 350 to the bit lines 280, 380. SGSs 230, 330 connect or isolate the source terminals of the NAND strings 250, 350 to source lines 285, 385. The SGDs and SGSs condition the word lines 270, 370 for read, program, and erase operations.

To read the data correctly from memory cells 260, 360 in a NAND configuration, the following requirements must be all met: (1) threshold voltage distributions in word lines are in proper states; (2) threshold voltage distributions in SGDs are in proper levels; and (3) threshold voltage distributions in SGSs are in proper levels. Without any one of these requirements, the data is unreadable.

Page 290, 390 of FIG. 2 and FIG. 3 is a group of memory cells that are programmed as a group. Multiple pages 290, 390 make up a block 295, 395. The memory cells in an individual block 295, 395 are erased together. A page is the smallest write unit, and a block is the smallest erasure unit.

This disclosure is not limited to the two dimensional and three dimensional memory arrays described in FIG. 2 and FIG. 3 but cover all relevant memory structures as understood by one of skill in the art. Other three dimensional arrays are possible, such as a NAND string formed in a U-shape. Other memory arrays are possible, such as memory arrays in a NOR configuration or a memory array made of ReRAM memory cells. Multiple two dimensional memory arrays or three dimensional memory arrays (monolithic or non-monolithic) may be formed on separate chips and then packaged together to form a stacked-chip memory device. Multiple memory arrays may be coupled together to form the non-volatile memory of a solid-state drive.

Host, such as host 80 of FIG. 1, may issue a PSE command to solid state drive 90 to physically wiped out any storage data on the solid-state drive so that any stored data cannot be read out by any method.

Figure 4:
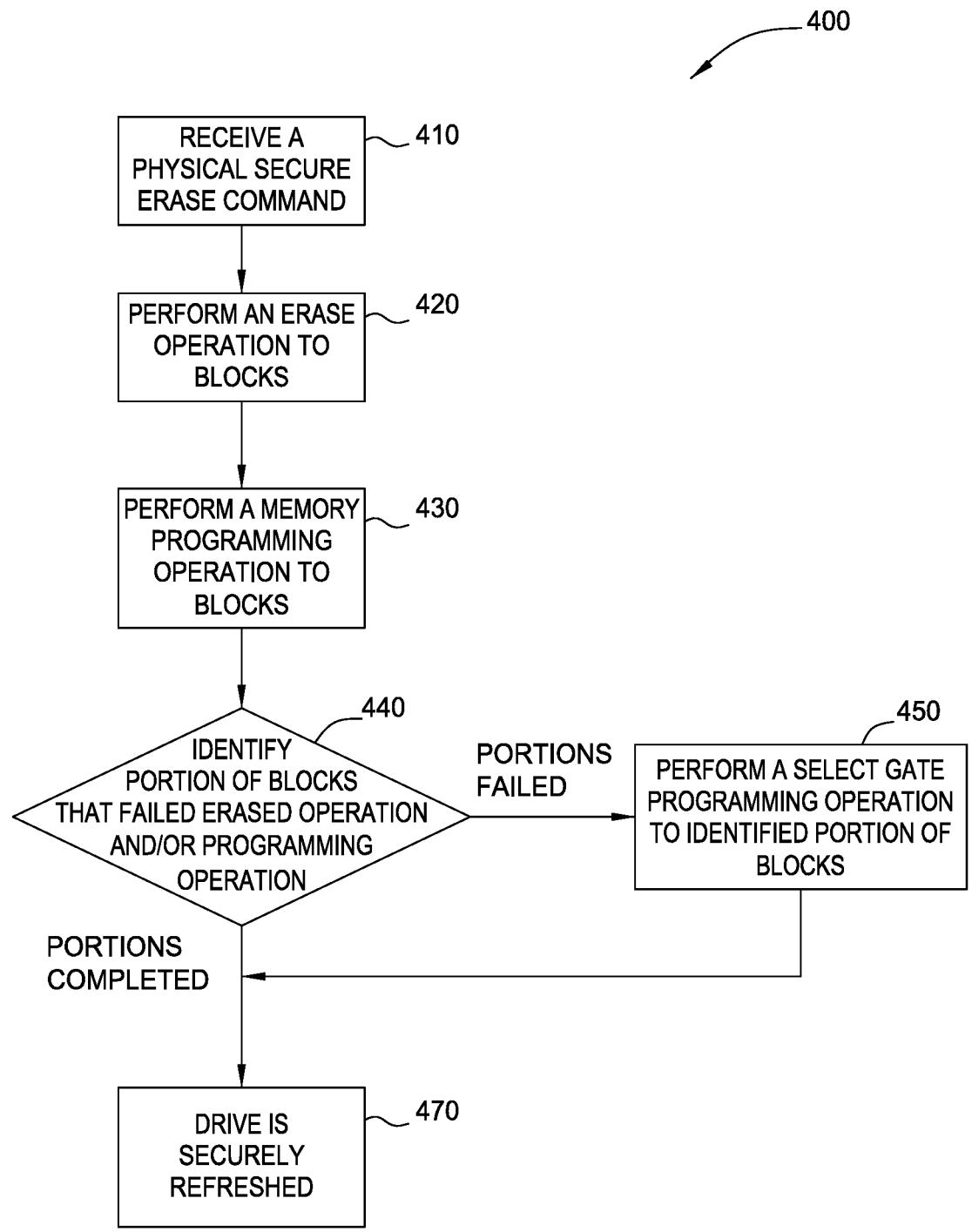
FIG. 4 is a flowchart showing one embodiment of PSE of SSDs.

FIG. 4 is a flowchart 400 showing one embodiment of PSE of SSDs. For illustration purposes, embodiments will be described in reference to a SSD 90 of FIG. 1 containing non-volatile memory, such as two dimensional flash memory array 210 of FIG. 2 or three dimensional flash memory cell array 310 of FIG. 3. Embodiments of PSE of SSDs may be performed on other non-volatile memory and other types and configurations of SSDs. PSE is performed by the controller 100 of the SSD 90. The controller 100 executes machine-executable instructions in a non-transitory machine readable medium by a computer, hardware, a processor (e.g., a microprocessor), and/or machine to perform one or more blocks in flowchart 400, such as executing firmware stored in ROM 122 and/or NVM 102.

At block 410, SSD 90 receives a PSE command from host 80 to either destroy any long term storage data in non-volatile memory 102 or to make any long term storage data in non-volatile memory 102 inaccessible.

Figure 6:
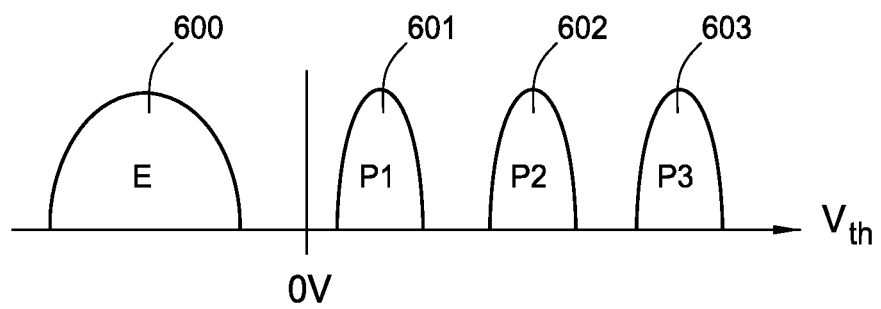
FIG. 6 is a schematic diagram of one example of the memory states of a memory cell.

At block 420, SSD 90 performs a block erase operation on blocks 295, 395 of the SSD 90. A block erase operation may be performed by setting the threshold voltage level of memory cells 260, 360 in a block to an erase state. FIG. 6 illustrates an example of an erased state of a MLC flash memory cell. Any types of memory cell storing any number of bits per cell are also applicable.

In certain embodiments, a block erase of blocks 295, 395 of SSD 90 excludes erasing of the system area of non-volatile memory (i.e., the memory cells storing the mapping of bad blocks, retired blocks, partially bad blocks, partially retired blocks is retained). In certain embodiments, a block erase of the blocks 295, 395 of SSD 90 includes erasing certain portions of the system area of non-volatile memory (i.e., logical-to-physical address mapping tables are erased).

At block 430, SSD 90 performs a memory programming operation to blocks 295, 395 of SSD 90. For example, a flash write may be conducted to push the memory cells out of the erased state. A flash write may be conducted by programming all the pages in block 295, 395 at the same time by sending one or more programming pulses to all of the memory cells in the block. For example, the flash write can set the threshold voltage level of the memory cells to any state above an erased state.

In certain embodiments, the memory programming operation of the blocks 295, 395 of SSD 90 excludes programming of the system area of non-volatile memory. In certain embodiments, programming of the blocks 295, 395 of SSD 90 includes programming certain portions of the system area of non-volatile memory.

At block 440, SSD 90 identifies which portion of the blocks 290, 390 failed the erase operation in block 420 and/or failed the programming in block 430. If the memory cells 260, 360 completed the erase operation at block 420 and completed the programming operation at block 430, data is unlikely to be readable and SSD proceeds to block 470. If the memory cells 260, 360 failed the erase operation, then data may still be readable from the memory cells. If the memory cells 260, 360 failed the programming operation, then data may still be readable from the memory cells. The controller 100 identified which memory cells 260, 360 failed one or both the erase operation in block 420 and the programming operation in block 430 to further perform operation to NAND strings containing the memory cells to make any remaining data unreadable.

The memory cells identified in block 440 may be associated with a bad NAND string 250, 350, a bad page 250, 350, or a bad block 295, 395. A portion of the blocks identified in block 440 refers to a sub-set of the blocks. A portion of the blocks could include a partial block in which one part of the block is still functioning and can be re-used for long term storage of data and in which a second part of the block is not functioning and should not be re-used for long term storage of data.

Figure 7:
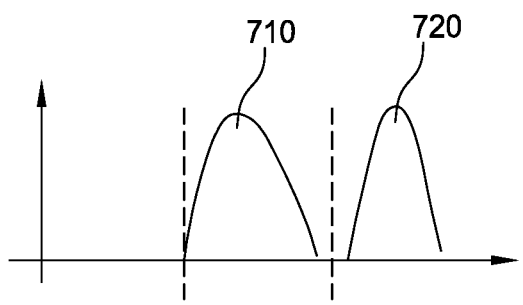
FIG. 7 is a schematic diagram of one example of programming select gates of a memory array.

At block 450, SSD 90 performs a select gate programming operation on the portion of the blocks 290, 390 identified in block 440 by programming the SGDs 220, 320 and/or SGSs 230, 330 of FIG. 2 and FIG. 3. FIG. 7 is a schematic diagram of one example of programming select gates of a memory array, such as programming the SGDs 220, 320 and/or SGSs 230, 330 of FIG. 2 and FIG. 3. The select gates are at threshold voltage level 710 in a read operation. In block 450 of FIG. 4, the SGDs and/or SGSs of the portion of the blocks identified in block 440 are programmed to an increased threshold voltage 720. The threshold voltage Vt of either SGDs, SGSs, or both are increased to make the word lines inaccessible (i.e., cannot be read correctly). Threshold voltages of select transistors are increased to a level that is above the desirable range for read operations. In one embodiment, the threshold voltage of SGDs of NAND strings containing memory cells which failed the erase operation and/or failed the programming operation is increased above a read level to make data in a portion of the blocks inaccessible. In one embodiment, the threshold voltage of SGSs of NAND strings containing memory cells which failed the erase operation and/or failed the programming operation is increased above a read level to make data in a portion of the blocks inaccessible. In one embodiment, the threshold voltage of both SGDs and SGSs of NAND strings containing memory cells which failed the erase operation and/or failed the programming operation is increased above a read level to make data in a portion of the blocks inaccessible. In read operations, select transistors are typically at about 1V for planar NAND and about 3V for 3D NAND. In certain embodiments, threshold voltages of either SGDs, SGSs, or both are increased to about 4V or above, preferably about 6V or above, so that word lines are inaccessible.

At block 470, SSD 90 is securely refreshed. The other portion of the blocks that did not have the select gates programmed in block 450 may be subsequently re-used in long term data storage. Flowchart 400 may include other additional blocks to perform PSE.

Figure 5:
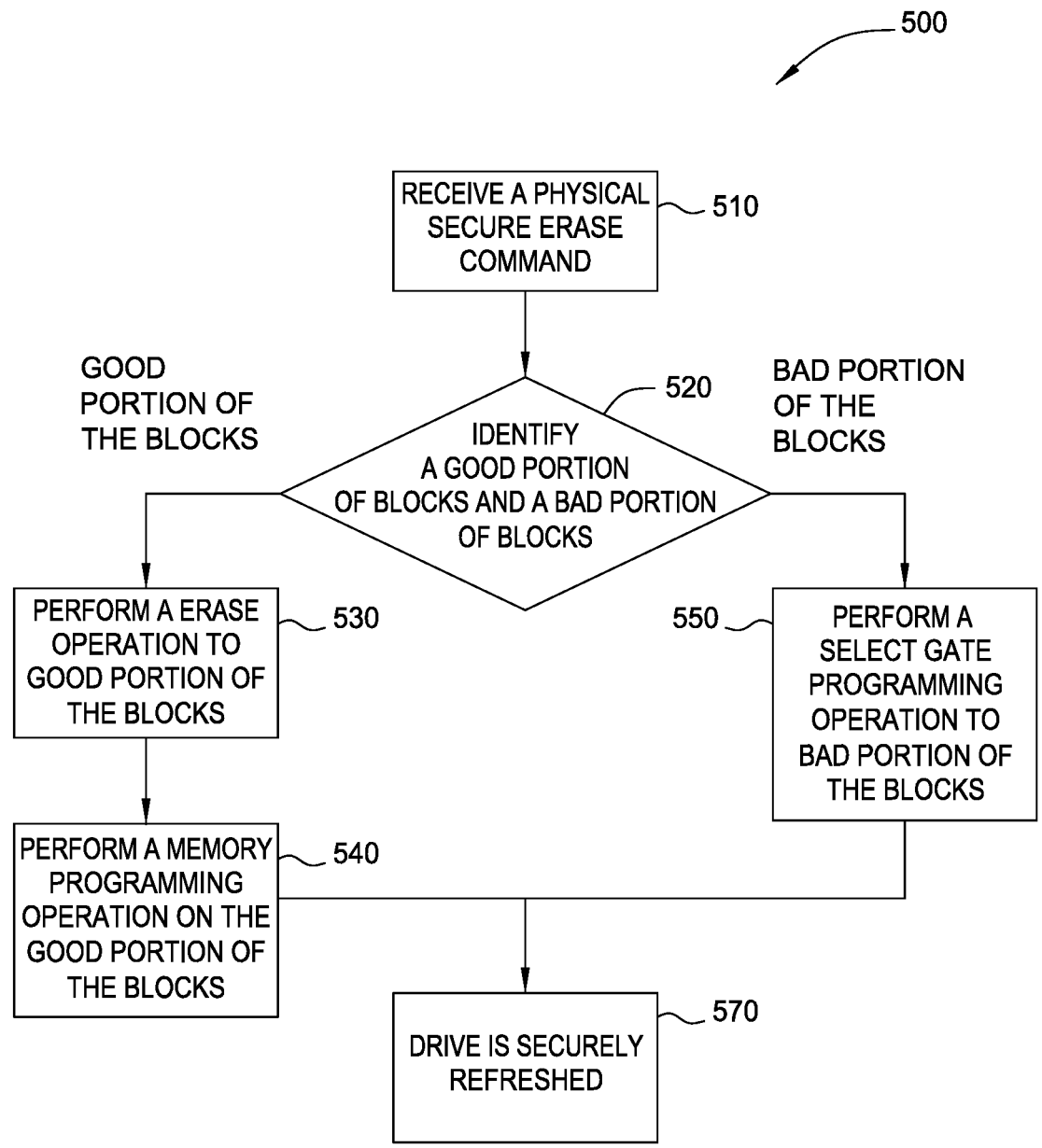
FIG. 5 is a flowchart showing another embodiment of PSE of SSDs.

FIG. 5 is a flowchart 500 showing another embodiment of PSE of SSDs. For illustration purposes, embodiments will be described in reference to a SSD 90 of FIG. 1 containing non-volatile memory, such as two dimensional flash memory array 210 of FIG. 2 or three dimensional flash memory cell array 310 of FIG. 3. Embodiments of PSE of SSDs may be performed on other non-volatile memory and other types and configurations of SSDs. PSE is performed by the controller 100 of the SSD 90. The controller 100 executes machine-executable instructions in a non-transitory machine readable medium by a computer, hardware, a processor (e.g., a microprocessor), and/or machine to perform one or more blocks in flowchart 500, such as executing firmware stored in ROM 122 and/or NVM 102.

At block 510, SSD 90 receives a PSE command from host 80 to either destroy any long term storage data in non-volatile memory 102 or to make any long term storage data in non-volatile memory 102 inaccessible.

At block 520, SSD 90 determines which portion of the blocks of non-volatile memory 102 are functioning (i.e., good) and which portion of the blocks are not functioning (i.e., bad). A portion of the blocks could include a partial block in which one part of the block is still functioning and can be re-used for long term storage of data and which a second part of the block is not functioning and should not be re-used for long term storage of data. Controller 100 of SSD 90 may store tables mapping which portion of the blocks in non-volatile memory 102 are good and which portion of the blocks in non-volatile memory 102 are bad.

At block 530, SSD 90 performs a block erase operation on the good portions of blocks 295, 395 of SSD 90. A block erase operation may be performed by setting the threshold voltage level of memory cells 260, 360 in a block to an erase state. FIG. 6 illustrates an example of an erased state of a MLC flash memory cell. Any types of memory cell storing any number of bits per cell are also applicable. In certain embodiments, the portion of the partially good-bad blocks and partially retired blocks that is still functioning also undergoes the block erase.

In certain embodiments, a block erase of the good portions of blocks 295, 395 of SSD 90 excludes erasing of the system area of non-volatile memory (i.e., the memory cells storing the mapping of bad blocks, retired blocks, partially bad blocks, partially retired blocks is retained). In certain embodiments, a block erase of the good portions of blocks 295, 395 of SSD 90 includes erasing certain portions of the system area of non-volatile memory (i.e., logical-to-physical address mapping tables are erased).

At block 540, SSD 90 performs a memory programming operation on the memory cells 260, 360 of the good portions of blocks 295, 395 of SSD 90. For example, a flash write may be conducted to push the memory cells out of the erased state. A flash write may be conducted by programming all the pages in block 295, 395 at the same time by sending one or more programming pulses to all of the memory cells in the block. For example, the flash write can set the threshold voltage level of the memory cells to any state above an erased state.

In certain embodiments, the memory programming operation of the good portions of blocks 295, 395 of SSD 90 excludes programming of the system area of non-volatile memory. In certain embodiments, programming of the good portions of blocks 295, 395 of SSD 90 includes programming certain portions of the system area of non-volatile memory.

At block 550, SSD 90 performs a select gate programming operation on the bad portions of blocks 295, 395 of solid state drive by programming the SGDs 220, 320 and/or SGSs 230, 330 of FIG. 2 and FIG. 3. The bad portion of the blocks may not be able to be erased and/or to be programmed. In certain embodiments, instead of attempting to erase/program the bad portion of the blocks and thus increasing the time to conduct a PSE, the SGDs and/or the SGSs of the bad portion of the blocks are programmed. FIG. 7 is a schematic diagram of one example of programming select gates of a memory array, such as programming the SGDs 220, 320 and/or SGSs 230, 330 of FIG. 2 and FIG. 3. The select gates are at threshold voltage level 710 in a read operation. In block 550 of FIG. 5, the SGDs and/or SGSs of the bad portion of the blocks identified in block 520 are programmed to an increased threshold voltage 720. The threshold voltage Vt of either SGDs, SGSs, or both are increased to make the word lines inaccessible (i.e., cannot be read correctly). Threshold voltages of select transistors are increased to a level that is above the desirable range for read operations. In one embodiment, the threshold voltage of SGDs of NAND strings identified as part of the bad portion of the blocks is increased above a read level to make data in a portion of the blocks inaccessible. In one embodiment, the threshold voltage of SGSs of NAND strings identified as part of the bad portion of the blocks is increased above a read level to make data in a portion of the blocks inaccessible. In one embodiment, the threshold voltage of both SGDs and SGSs of NAND identified as part of the bad portion of the blocks is increased above a read level to make data in a portion of the blocks inaccessible. In read operations, select transistors are typically at about 1V for planar NAND and about 3V for 3D NAND. In certain embodiments, threshold voltages of either SGDs, SGSs, or both are increased to about 4V or above, preferably about 6V or above, so that word lines are inaccessible.

At block 570, SSD 90 is securely refreshed. The good portion of the blocks may be subsequently re-used in long term data storage. Flowchart 500 may include additional blocks to perform PSE.

FIG. 6 is a schematic diagram of one example of the memory states of a multi-level memory cell (MLC) or X2 cell storing 2 bits/cell, such as memory cells 260, 360 of FIG. 2 and FIG. 3. The X2 cell has four threshold voltage Vth distributions or levels representing four memory states 600, 601, 602, 603. Memory state 600 represents an erased state E. Memory states 601, 602, 603 represent three programmed states P1, P2, P3 respectively.

There is data risk that a bad portion of the blocks may fail an erase or programming operation. Thus, data may still be readable from the word lines of the memory array. Due to an incomplete erase or an incomplete programming, such as a flash write to a block may fail to destroy or overwrite the data, data in a bad portion of a block may still be accessible after PSE. As described in flowchart 400 in FIG. 4 and flowchart 500 in FIG. 5, the threshold voltage of SGSs and/or SGDs of (a) NAND strings containing memory cells which failed the erase operation and/or the programming operation or (b) identified bad portion of the blocks is increased above a read level to make data in such portion of the blocks inaccessible.

FIG. 7 is a schematic diagram of one example of programming the select gates, such as programming the SGDs 220, 320 and/or SGSs 230, 330 of FIG. 2 and FIG. 3. The select gates are at threshold voltage level 710 in a read operation. In block 450 of FIG. 4 or in block 550 of FIG. 5, the SGDs and/or SGSs are programmed to an increase threshold voltage 720. The threshold voltage of either SGDs, SGSs, or both are increased to make the word lines inaccessible (i.e., cannot be read correctly). Threshold voltages of select transistors are increased to a level that is above the desirable range for read operations. In read operations, select transistors are typically at about 1V for planar NAND and about 3V for 3D NAND in read operations. In certain embodiment, threshold voltages of either SGDs, SGSs, or both are increased to about 4V or above, preferably about 6V or above, so that word lines are inaccessible.

The portion of the blocks that did not have the select gates programmed may be subsequently re-used in erase, programming, and reading operations for long term data storage. After the physical secure, the solid state drives may be used again in a refreshed, like-new condition for the portion of the blocks that did not have select gates programmed as described in various embodiments in the present disclosure. In certain embodiments, the portion of the blocks that had selected gates programmed is retired from subsequent use in long term data storage.

Embodiments of PSE of solid states drive as disclosed provide complete security by either destroying stored data or making stored data inaccessible. In certain embodiments, increasing the threshold voltage of SGDs, SGSs, or both permanently makes the word lines inaccessible (i.e., would require service from the manufacturer of the SSD to access the word lines).

Embodiments of PSE of solid states drives as disclosed rapidly and completely destroy data or makes data inaccessible. Such PSE takes less than 20 ms per block, typically between about 5 to 15 ms per block.

While the foregoing is directed to embodiments of the present disclosure, other and further embodiments of the disclosure may be devised without departing from the basic scope thereof, and the scope thereof is determined by the claims that follow.

What is claimed is:

1. A solid state drive, comprising:
   a controller;
   means for storing data in a plurality of blocks; and
   memory erasing instructions that, when executed by the controller, cause the controller to:
   erase a first portion of the plurality of blocks;
   program the first portion of the plurality of blocks; and
   render a second portion of the plurality of blocks unreadable, wherein rendering the second portion unreadable comprises increasing a threshold voltage of select gate drain transistors (SGDs) to a level above a read level.

2. The solid state drive of claim 1, wherein the second portion of the plurality of blocks is permanently rendered inaccessible.

3. The solid state drive of claim 1, wherein the first portion of the plurality of blocks is refreshed for further use as long term data storage.

4. A solid state drive, comprising:
   means for storing data in a plurality of blocks;
   means to receive a physical secure erase command from a host;
   means for performing a block erase operation on blocks of the means for storing data;
   means for performing a memory programming operation on blocks erased by the means for performing a block erase operation;
   means for identifying blocks that failed to erase;
   means to perform a select gate programming operation, wherein the select gate programming operation comprises increasing a threshold voltage of select gate drain transistors (SGDs) to a level above a read level; and means to securely refresh the means for storing data.

5. The solid state drive of claim 4, wherein the means for performing a block erase operation are capable of excluding erasing of a system area of non-volatile memory.

6. The solid state drive of claim 4, wherein the means for performing a block erase operation are capable of erasing certain portions of a system area of non-volatile memory.

7. The solid state drive of claim 4, wherein the means for performing a memory programming operation are capable of conducting a flash write.

8. The solid state drive of claim 7, wherein the flash write is conducted by programming all pages of a block to be erased.

9. The solid state drive of claim 8, wherein all pages are programmed at the same time.

10. The solid state drive of claim 9, wherein the flash write is performed by one or more programming pulses to all memory cells of the block.

11. The solid state drive of claim 4, further comprising means to identify which portion of the block failed the block erase operation.

12. The solid state drive of claim 4, wherein the means for identifying blocks that failed to erase also identifies blocks that failed to program.

13. A solid state drive, comprising:
means for storing data in a plurality of blocks;
means to receive a physical secure erase command from a host;
means to determine which portion of blocks of the means for storing data is functioning;
one or more of:
means to program select gate drain transistors; or
means to program select gate source transistors; or
both means to program select gate drain transistors and means to program select gate source transistors;
means to perform a select gate programming operation, wherein the select gate programming operation comprises increasing a threshold voltage of select gate drain transistors (SGDs) to a level above a read level; and
means to securely refresh the means for storing data.

14. The solid state drive of claim 13, further comprising means for determining which portions of the blocks of the means for storing data are not functioning.

15. The solid state drive of claim 13, further comprising means to program a threshold voltage of select gate drain transistors greater than a read level.

16. The solid state drive of claim 13, further comprising means to program a threshold voltage of select gate source transistors greater than a read level.

17. The solid state drive of claim 13, further comprising means to program a threshold voltage of select gate source transistors and select gate drain transistors greater than a read level.

18. The solid state drive of claim 13, further comprising means to identify one or more failed erased memory cells.

19. The solid state drive of claim 13, further comprising means to identify one or more failed programmed memory cells.

20. The solid state drive of claim 13, further comprising means to make word lines of the means for storing data inaccessible.

* * * * *